US011703408B1

(12) United States Patent
Leonard et al.

(10) Patent No.: US 11,703,408 B1
(45) Date of Patent: Jul. 18, 2023

(54) VERSATILELY MOUNTABLE PRESSURE SENSING APPARATUS, SYSTEM, AND/OR METHOD

(71) Applicant: Senva, Inc., Beaverton, OR (US)

(72) Inventors: Scott E. Leonard, Portland, OR (US); Kent Jeffrey Holce, Portland, OR (US)

(73) Assignee: Senva, Inc., Beaverton, OR (US)

( * ) Notice: Subject to any disclaimer, the term of this patent is extended or adjusted under 35 U.S.C. 154(b) by 0 days.

(21) Appl. No.: 17/246,590

(22) Filed: Apr. 30, 2021

Related U.S. Application Data

(60) Provisional application No. 63/018,510, filed on Apr. 30, 2020.

(51) Int. Cl.
*G01L 9/06* (2006.01)
*G01L 9/00* (2006.01)
*B81B 7/02* (2006.01)

(52) U.S. Cl.
CPC .................. *G01L 9/06* (2013.01); *B81B 7/02* (2013.01); *B81B 2201/0264* (2013.01); *G01L 9/0054* (2013.01)

(58) Field of Classification Search
None
See application file for complete search history.

(56) References Cited

U.S. PATENT DOCUMENTS

| 2013/0145853 | A1* | 6/2013 | Donzier | G01L 9/0042 73/706 |
| 2018/0031159 | A1* | 2/2018 | Monnin | F16L 41/03 |
| 2020/0412164 | A1* | 12/2020 | Miller | H02J 7/00712 |
| 2022/0168603 | A1* | 6/2022 | Duda | A62C 3/16 |

* cited by examiner

*Primary Examiner* — Octavia Davis Hollington
*Assistant Examiner* — Jermaine L Jenkins
(74) *Attorney, Agent, or Firm* — Northwest IP Law Group, LLC

(57) ABSTRACT

Pressure sensors are configured for accurate, non-position sensitive pressure measurement. They can offer microprocessor-based features for optimized measurement, control, and signaling using precision-calibrated silicon piezoresistive microelectromechanical (MEMS) sensors provisioned within a durable, versatilely mountable housing. Such sensors can be mounted readily in alternate locations, configurations, and/or positions. They can also offer real-time temperature compensation, enable selectable analog outputs (such as 2-wire mA, 3-wire mA, or 3-wire V signals), enable adjustable range or subrange selection, support uni- or bi-directional settings, and allow local (pushbutton) or remote (via dry contacts) zeroing for accuracy.

7 Claims, 14 Drawing Sheets

VERSATILELY MOUNTABLE PRESSURE SENSING APPARATUS, SYSTEM, AND/OR METHOD

RELATED APPLICATIONS

This application is a nonprovisional of, and claims the benefit of priority from, U.S. Provisional Patent Application No. 63/018,510, filed Apr. 30, 2020, entitled "PRESSURE SENSING APPARATUS, SYSTEM, AND/OR METHOD", which is hereby incorporated by reference in its entirety.

COPYRIGHT NOTICE

© 2020 Senva, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR § 1.71(d), (e).

TECHNICAL FIELD

The present application is directed to the field of pressure measurement and, more particularly, to apparatuses, systems, and/or methods for use in measuring dry pressure in industrial heating, ventilation, and air conditioning (hereinafter "HVAC") applications involving dry, oil-less air, N2, or the like.

BACKGROUND

In building automation, HVAC, and other industrial applications, it is often desirable to measure or otherwise monitor air/gas pressure at one or more locations in ducting, etc. Pressure sensor technology known in the art typically employs a welded capacitive sensor with discrete electronics (no microprocessor). While field proven, such typical designs are inherently bulky and disadvantageously position sensitive.

Static pressure, which refers to the resistance to airflow in a heating and cooling system's components and duct work, is one of the key metrics measured as part of HVAC design. If the status pressure is too great, the air flow becomes restricted, or even stopped. Air needs to flow through the ducts for a properly operating system. If the resistance to the air circulating through the ducts is too great, the unit will have to work harder than it is designed to in order to push air through the ducts. Too much static pressure is energy inefficient and potentially damaging to an HVAC system.

Common sources of high static pressure include poor system design, improper ductwork installation, and choices and conditions of filters used. If pressure problems are not sufficiently detected and remedied, an HVAC system will operate inefficiently. With improper pressure levels, an HVAC system may be noisy. It also may result in sub-optimal airflow (evidenced by hot or cold pockets of air). High static pressure may also cause equipment to fail sooner than it otherwise would. If the static pressure is significant enough, the result might be systems failure.

Pressure sensors are commonly used in efforts to make HVAC systems more efficient. Common applications include monitoring or troubleshooting ventilator or fan control, air pressure control, and air filter status. Pressure sensors generally measure pressure and air flow throughout the system in order to try and ensure effective air distribution. Measuring pressure in discrete rooms or distribution branches of an HVAC system can help the HVAC system reduce energy consumption through optimization of the heating, cooling, and air flow demands.

Generally, employing multiple pressure sensors allows for the monitoring of a large number of potential points of concern in an HVAC system. Unfortunately, the expense of installing numerous pressure sensors can be costly, but in terms of financial cost, and the space required to accommodate the sensor equipment. Often, pressure sensors are mounted in a control panel, where space is at a premium, making it disadvantageous to mount numerous pressure sensors. Mounting a traditional pressure sensor in a control panel, on a DIN rail, for example, requires approximately 2.75 to 3.00 inches of space due to the large width of the sensors. Even if a pressure sensor is duct-mounted, the sensors take up valuable space. Regardless, traditional pressure sensors are configured for a specific installation location (e.g., duct or panel, etc.). An installer are often forced to separately inventory large numbers of both duct-mount pressure sensors and panel/remote-mount pressure sensors to maintain sufficient flexibility for future demands.

Furthermore, traditional pressure sensors are calibrated for taking measurements at only a specific, discrete pressure range. Thus, an equipment installer is typically forced to inventory or order a disadvantageously wide assortment of pressure sensors in order to accommodate the large potential range of pressures to be monitored. Further, if the system configuration or components are changed and the designed pressure at the monitored location changes, an installer likely will have to replace the pressure sensor with a new pressure sensor in order to accommodate the new pressure range. Even once installed, traditional pressure sensors can be hard to relocate for subsequent servicing or diagnosis if they are installed in dark locations such as drop ceilings, crawl spaces, etc.

SUMMARY

The present application encompasses apparatuses, systems, and/or methods for measuring pressure in HVAC and similar systems, such as those involving dry, oil-less air, N2, or the like. Presently disclosed pressure sensors can be employed in various industrial applications, such as in monitoring building (zone) pressure, measuring the condition of air filters and the like, and measuring and/or monitoring duct/static pressure at one or more particular locations, as well as OEM HVAC applications, etc.

Present pressure sensors can be configured to be accurate and non-position sensitive, and they can incorporate microprocessor-based features for optimized measurement, control, and signaling. One or more specific present embodiments can utilize a precision-calibrated silicon microelectromechanical (MEMS) sensor, such as a piezoresistive pressure sensor circuit, provisioned within a durable, versatilely mountable housing. Present sensors can also employ an internal temperature sensor in order to achieve real-time temperature compensation in measurements. One or more embodiments can also enable selectable analog outputs (such as 2-wire mA, 3-wire mA, or 3-wire V signals) and enable adjustable range or subrange selection, as well as uni- or bi-directional settings (including appropriate software scaling and amplifier gain adjustments). Present sensors can also allow local (pushbutton) or remote (via dry contacts) zeroing to help active initial accuracy and maintain accuracy over time.

In order to provide versatile mounting options, save valuable installation space, and help reduce inventory requirements, one or more present embodiments can comprise an innovative housing design that can include a spring-actuated or flexible member that allows the sensor to clip to a DIN rail in alternate positions (e.g., front and side orientations, etc.). A pressure probe can be provided to connect with the housing, e.g., by employing a desired length of flexible tubing, etc. Further, the housing can also be configured so that a pressure probe can directly couple with the housing for uniform duct mounting applications, while also alternatively allow for remote probe mounting by separating the probe base from the housing (leaving the flexible tube connected to the remote probe. To indicate location and the sensor in dark locations, and provide status information, the housing can include an LED indicator and/or an employ an optional LCD display.

The result can comprise a compact, panel-saving device with versatile mounting options, as described and illustrated below. Such device can be particularly well-suited for measuring pressure of dry, oil-less air, N2, or the like.

Those skilled in the relevant art will appreciate that alternative embodiments could also be constructed consistent with the present subject matter. Additional aspects and advantages of the present subject matter will be apparent from the following detailed description of preferred embodiments, which proceeds with reference to the accompanying drawings.

DETAILED DESCRIPTION

Described within the present application are various illustrative apparatuses, systems, and/or methods for measuring pressure in applications such as HVAC, industrial automation, and the like. The above-indicated drawing figures are provided to illustrate certain aspects and advantages of the present subject matter. Such drawing figures are meant to illustrate one or more aspects of embodiments consistent with the present subject matter. These are illustrated example embodiments of devices which can be constructed to embody, at least in part, one or more aspects of the present subject matter. Of course, the one or more specific apparatus, system, and/or method embodiments illustrated, as well as the individually described components comprising the illustrated devices, or details describing the specifically illustrated apparatus, system, and/or method embodiments may be able to be changed without departing from the scope of the present subject matter. It is the Applicant's intention that the specific example embodiments illustrated herein are presented only for purposes of facilitating understanding of the present subject matter, and they are not intended to represent limits on the claims made thereto.

Figure 1:
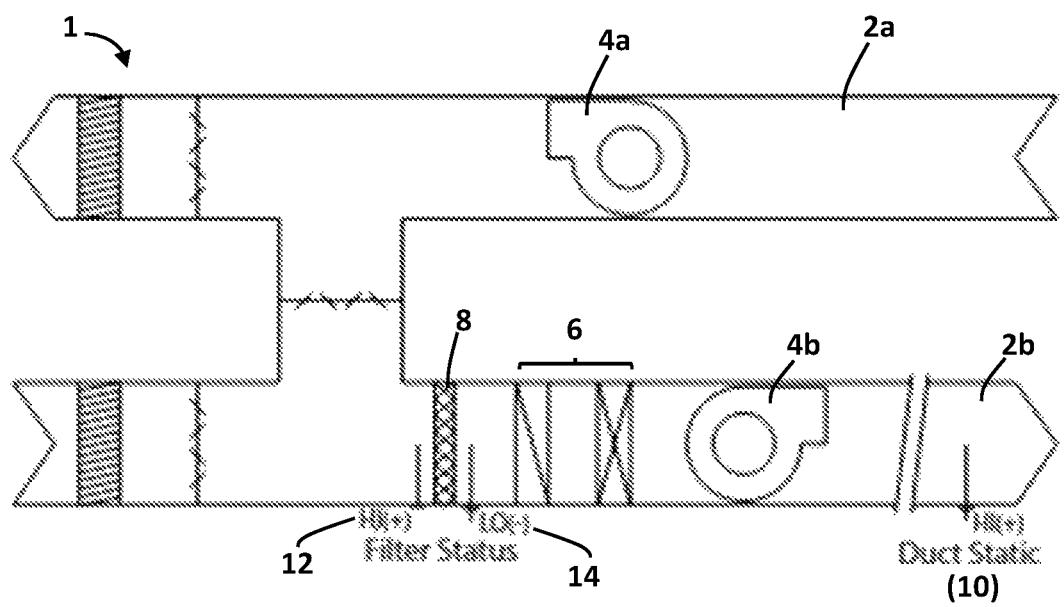
FIG. 1 depicts a system diagram illustrating various installation locations for one or more pressure sensor embodiments.

FIG. 1 depicts a system diagram illustrating various installation locations for one or more pressure sensor embodiments. With particular reference to FIG. 1, a portion of an HVAC system, 1, is illustrated, containing ducts 2a, 2b and two blowers 4a, 4b. HVAC system 1 also includes additional HVAC elements 6 and a filter 8. As depicted in FIG. 1, typical applications for pressure sensors, such as those describe in detail below, can include measuring status pressure in duct 2b at location 10. In one example application, this can be accomplished by installing a static pressure probe and pickup tube approximately ⅔ of the way down the discharge air duct and plumb it to the high (+) port on a pressure sensor for positively pressurized ducts. In a second illustrative application, the pressure drop across filter 8 can be measured by connecting the high (+) port to a pressure probe installed at location 12, and connecting the low (−) port to a probe installed at location 14, and comparing the corresponding readings. As a third illustrative application, air/flow velocity can be measured by using a pitot tube and plumbing a high (+) port to a total pressure (Pt) connection, and a low (−) port to a static pressure (Ps) connection to directly read Pt−Ps=Pv. It should be appreciated that in so doing, one should apply any constant provided by pitot tube manufacturer. Of course, those skilled in the art will appreciate that numerous alternative and/or additional applications could be adopted consistent with one or more pressure sensor embodiments as described herein.

It should be noted that, while the term "pressure sensor" is primarily used throughout this application, the terms "pressure sensor" and "pressure transmitter" are at times be used interchangeably throughout this application, as they are often referred to the art. For example, those skilled in the art will appreciate the functionality disclosed herein, has characteristics typical of devices often referred to as a "pressure transmitter," wherein, for example, embodiments can employ components and circuitry that can linearize, compensate, and amplify a signal from a pressure transducer, strain gauge, and/or other pressure measuring circuitry, with typical signal types such as voltage (e.g., 0 to 5 or 0 to 10 volts), milliamp (e.g., 4 to 20 milliamp), or digital then being transmitted to a remote receiver. However, for ease of comprehension, such device is also referred to with the term "pressure sensor" herein.

One present embodiment of a pressure sensor consistent with the present subject matter can comprise a dry media pressure transmitter and can include fixed ranges optimized for building (zone) pressure, filter measurement, and static duct applications. One or more embodiments of an innovative static probe can additionally or optionally be integrated with pressure transmitter unit or can be mounted remotely for static pressure.

For example, FIGS. 2A-9 illustrate one present embodiment of a pressure sensor consistent with the present subject matter. Such embodiment can comprise a dry media pressure transmitter and can include fixed ranges optimized for building (zone) pressure, filter measurement, and static duct applications. One or more embodiments of an innovative static probe can additionally or optionally be integrated with pressure transmitter unit or can be mounted remotely for static pressure. In the specific illustrative embodiments disclosed in FIGS. 2A-9, some aspects of the novel subject matter include, without limitation, range and output specific models (e.g., ranging from 0-0.1 to 0-25", etc.), an optional pressure probe that can be selectively adapted for duct or remote mounting, a zero push button and contact closure, etc.

Figures 2A, 2B:
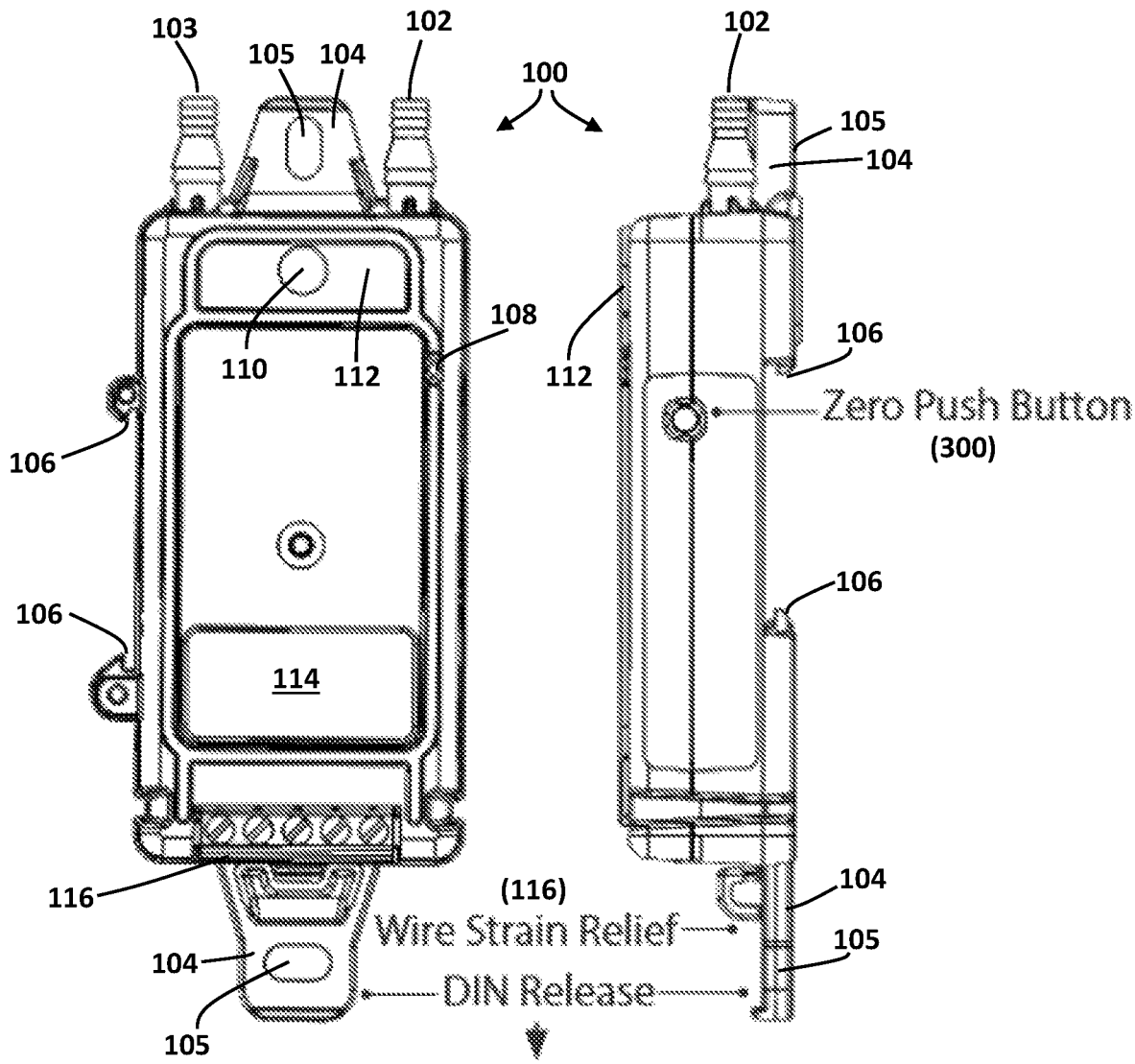
FIG. 2A depicts a front view of a first embodiment of a pressure sensor consistent with the present subject matter.
FIG. 2B depicts a side view of the first embodiment of FIG. 2A.
Figure 3:
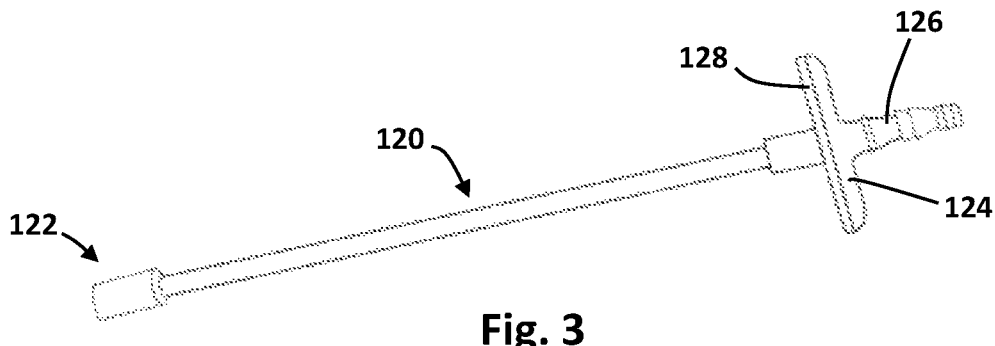
FIG. 3 depicts an embodiment of a versatile pressure probe for enabling both remote and duct mounting.
Figures 4, 5:
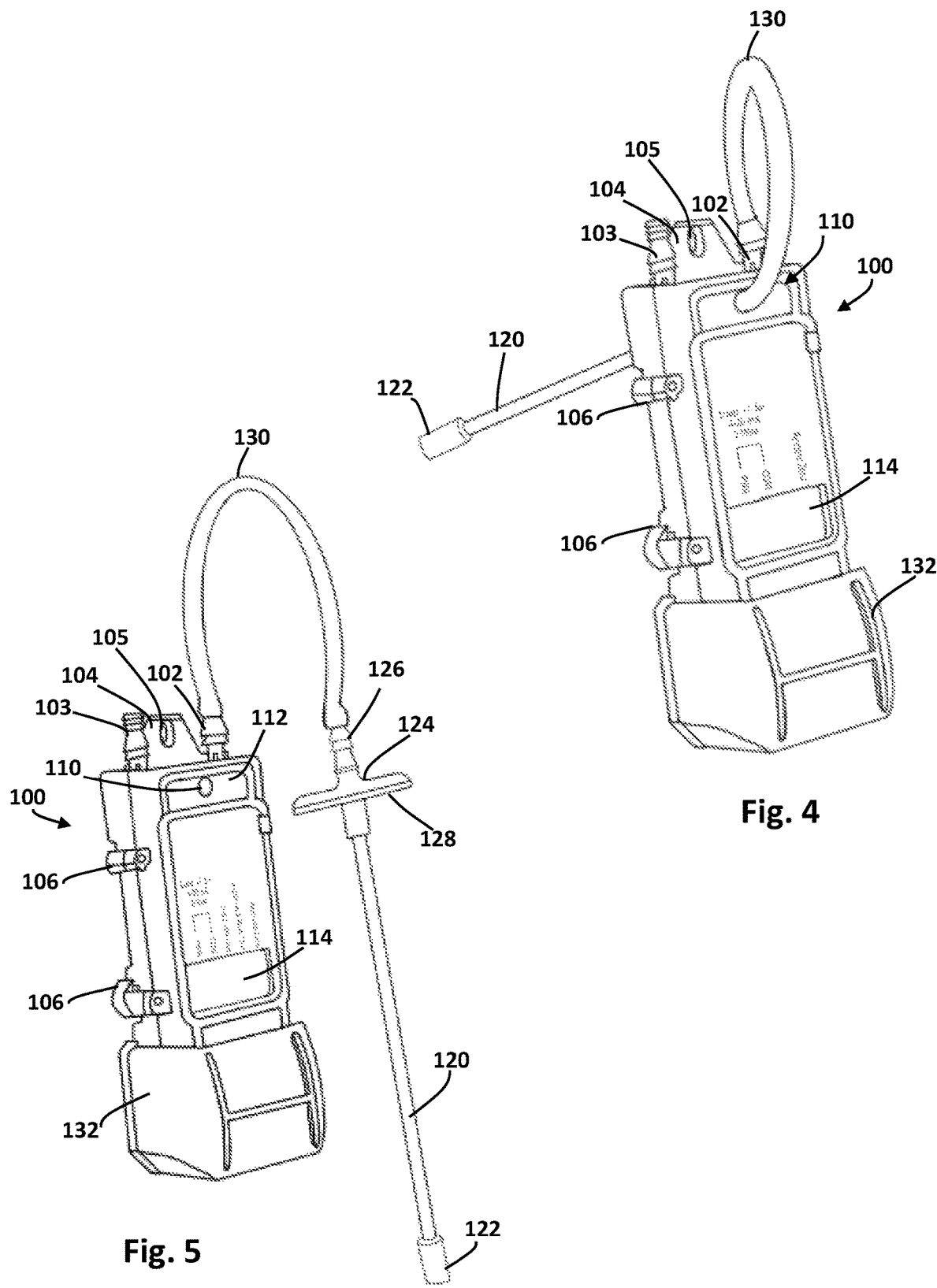
FIG. 4 depicts the pressure sensor of FIGS. 2A-B and the probe of FIG. 3 configured for a duct mount application.
FIG. 5 depicts the pressure sensor of FIGS. 2A-B and the probe of FIG. 3 configured for a remote mount application.

With specific reference to FIGS. 2A-B, a first embodiment of a pressure sensor consistent with the present application is depicted for illustration and reference. In particular, FIG. 2A depicts a front view of a first embodiment of a pressure sensor consistent with the present subject matter, and FIG. 2B depicts a side view of the first embodiment of illustrated in FIG. 2A. With particular reference to FIGS. 2A-9, a pressure sensor 100 id depicted as having a high pressure port 102 and low pressure port 103. Sensor 100 also has mounting tabs 104 that are configured to define apertures 105 through which sensor 100 can be mounted to a surface, such as a duct, via material-appropriate fasteners. Similarly, the housing of sensor 100 can be configures to include one or more flexible members 106 that can allow sensor 100 to mount on a DIN rail in alternative positions, such as back mount or side mount (as described and illustrated below). The housing of senor 100 also includes a probe insertion element 112 that can define an aperture 110 through which a probe 120 can be extended to configure sensor 100 for a duct mount (See FIG. 4). Alternatively, probe 120 can be removed from element 112 and attached via tube 130 for a remote mount application (See FIG. 5).

With specific reference to probe 120, probe 120 can include an integrated snubber/damper 122 for more accurate measurements, a mounting plate 124 (which can be fastened via fasteners to a surface in a remote application, or, alternatively, couples with the back of the housing of sensor 100 such that the probe extends through aperture 110 for a duct mounted probe application. Mounting plate 124 also includes a gasket 128 to secure an improved seal on the mounting location or when the probe is coupled to the housing of sensor 100. Mounting plate 125 includes a hose barb 126 that is sized to accept hose 130 in standard sizes, such as ⅛" and/or ¼".

Figure 6:
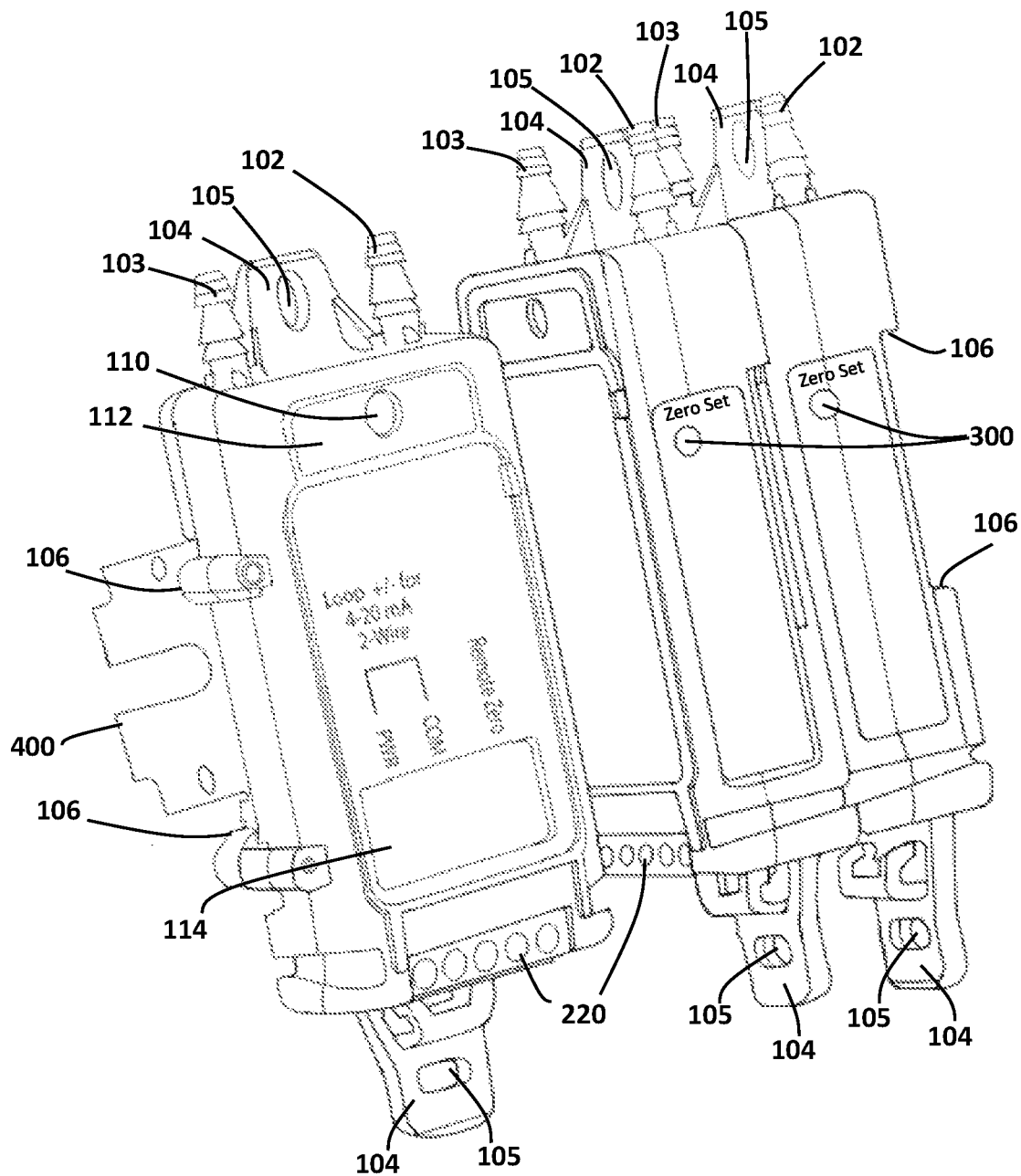
FIG. 6 depicts three pressure sensors of FIGS. 2A-B mounted in two alternate mounting configurations.
Figure 7A:
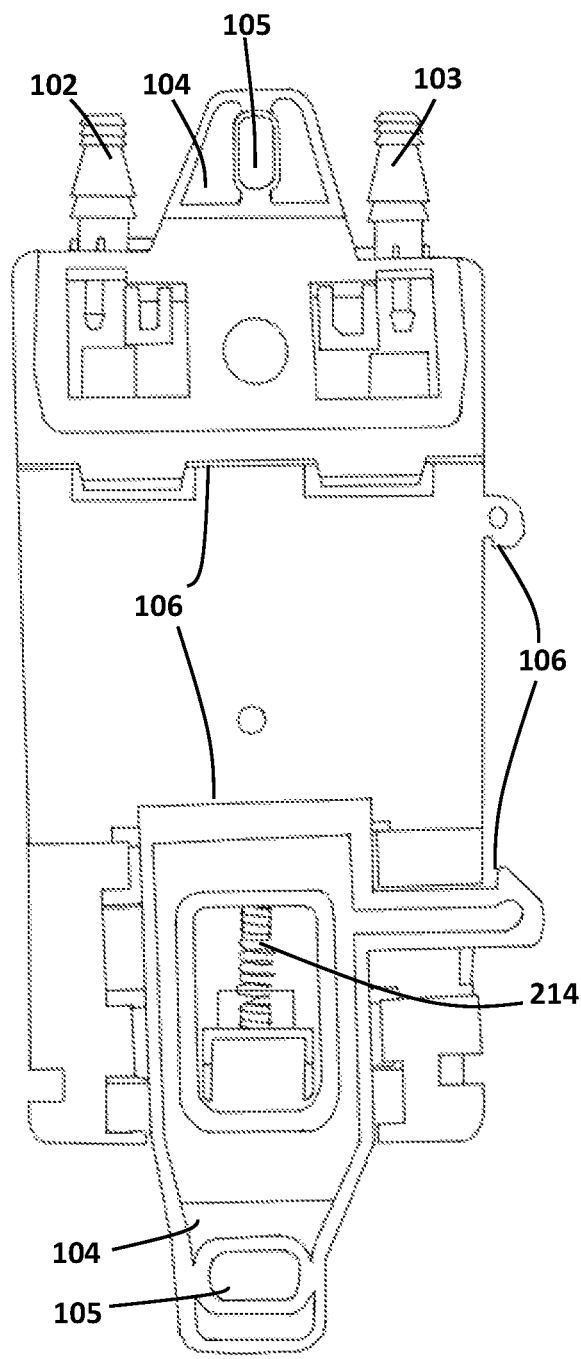
FIG. 7A depicts the back of a pressure sensor housing consistent with the present subject matter, constructed to facilitate the alternate mount configurations illustrated in FIG. 6 above (and FIGS. 11-12 below).
Figure 7B:
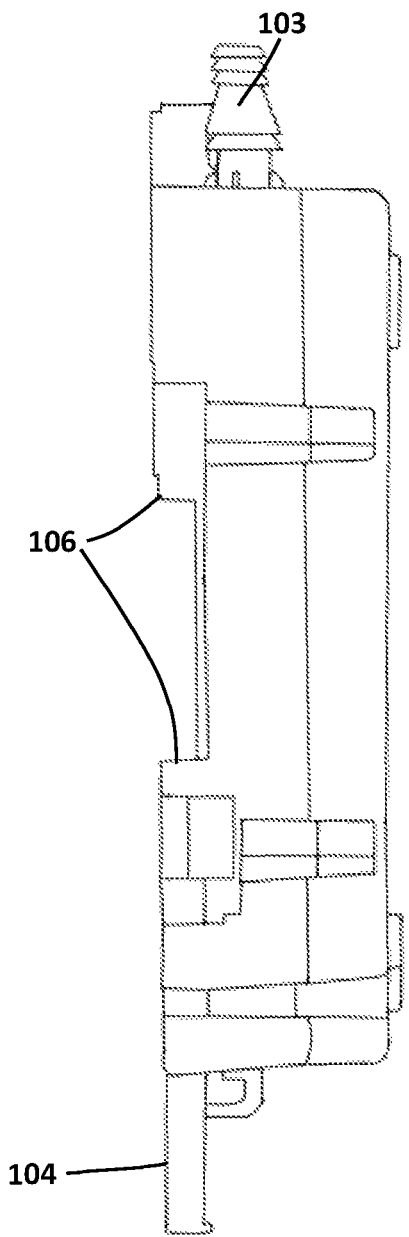
FIG. 7B depicts the side of a pressure sensor housing of FIG. 7A, constructed to facilitate the alternate mount configurations illustrated in FIG. 6 above (and FIGS. 11-12 below).
Figure 7C:
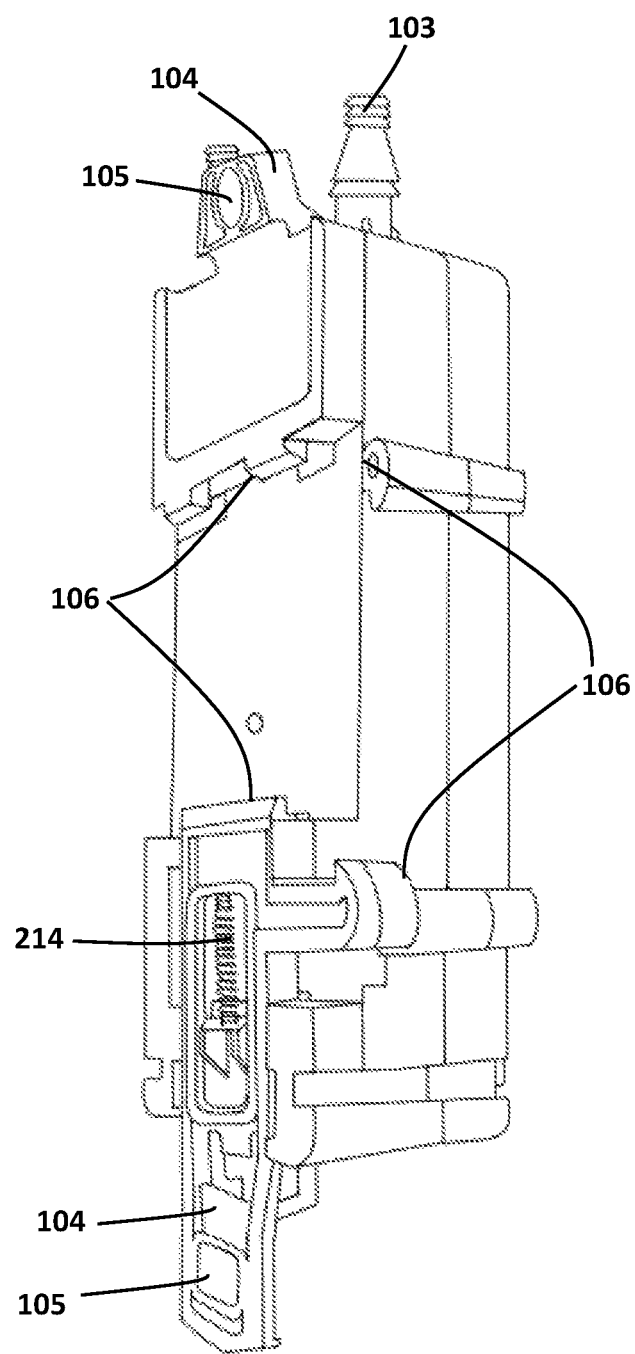
FIG. 7C depicts a perspective view illustrating the both the housing back of FIG. 7A and housing side of FIG. 7B, both constructed to facilitate selective alternate mounting configurations such as illustrated in FIG. 6 above (and FIGS. 11-12 below).

As can be appreciated in FIG. 6, sensor 100 can be mounted, using flexible member 106, to a DIN rail in alternate configurations, such as depicted in FIG. 6 as back mounted and side mounted. Those skilled in the art will readily appreciate that enabling side mount configurations (as depicted in FIG. 6) results in significant space savings on limited control panel available space. This is accomplished, at least in part in the presently illustrated embodiment, buy having a spring member 214 which provides spring tension on at least one of the flexible members 106 in order to enable secure attachment to a DIN rail or other suitable mounting surface.

Figure 8:
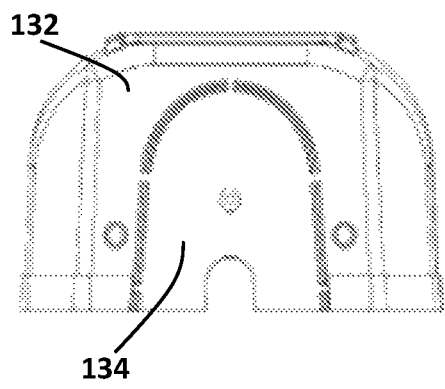
FIG. 8 illustrates a conduct/terminal cover with an illustrated optional knock-out portion.
Figure 9:
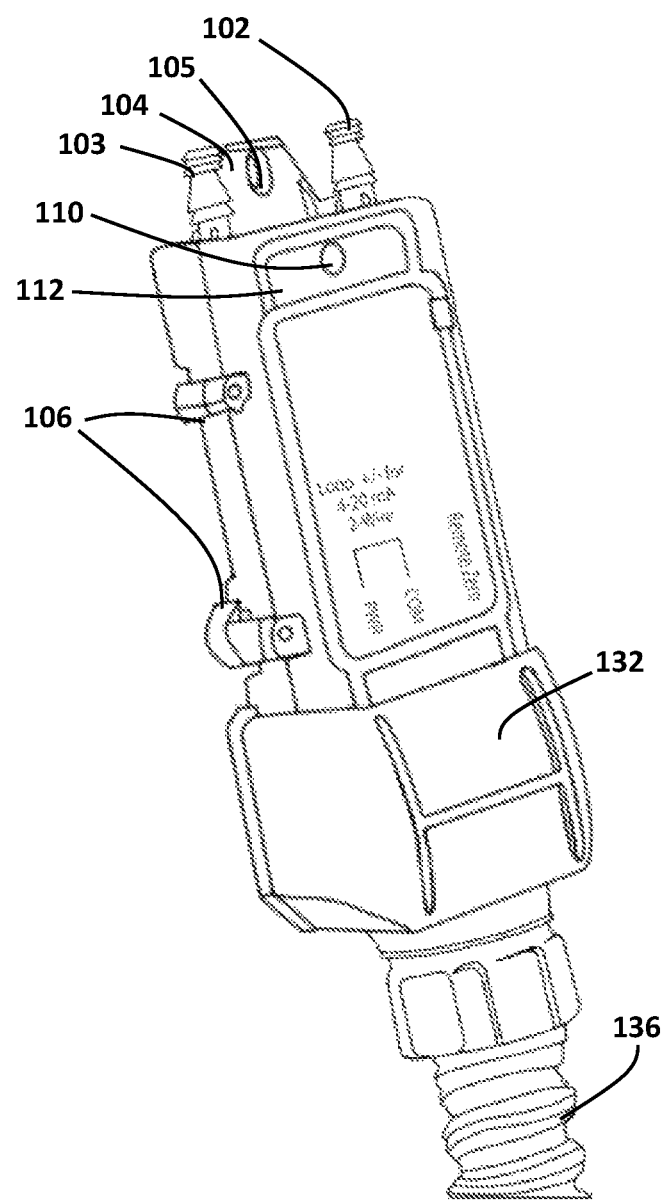
FIG. 9 depicts the pressure sensor of FIGS. 2A-B employing the conduit/terminal cover of FIG. 8.
Figure 10A:
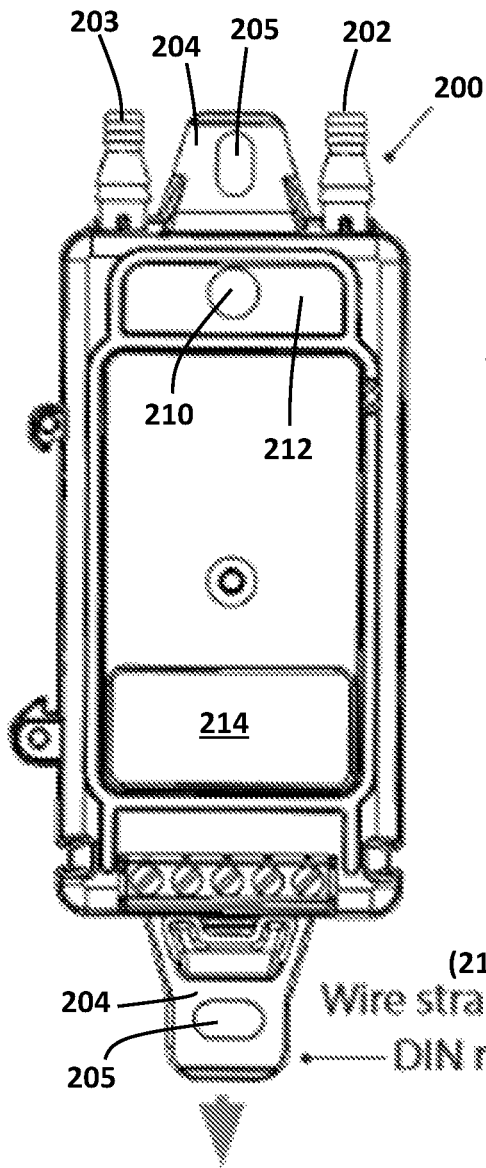
FIG. 10A depicts a front view of a second embodiment of a pressure sensor consistent with the present subject matter.
Figure 10B:
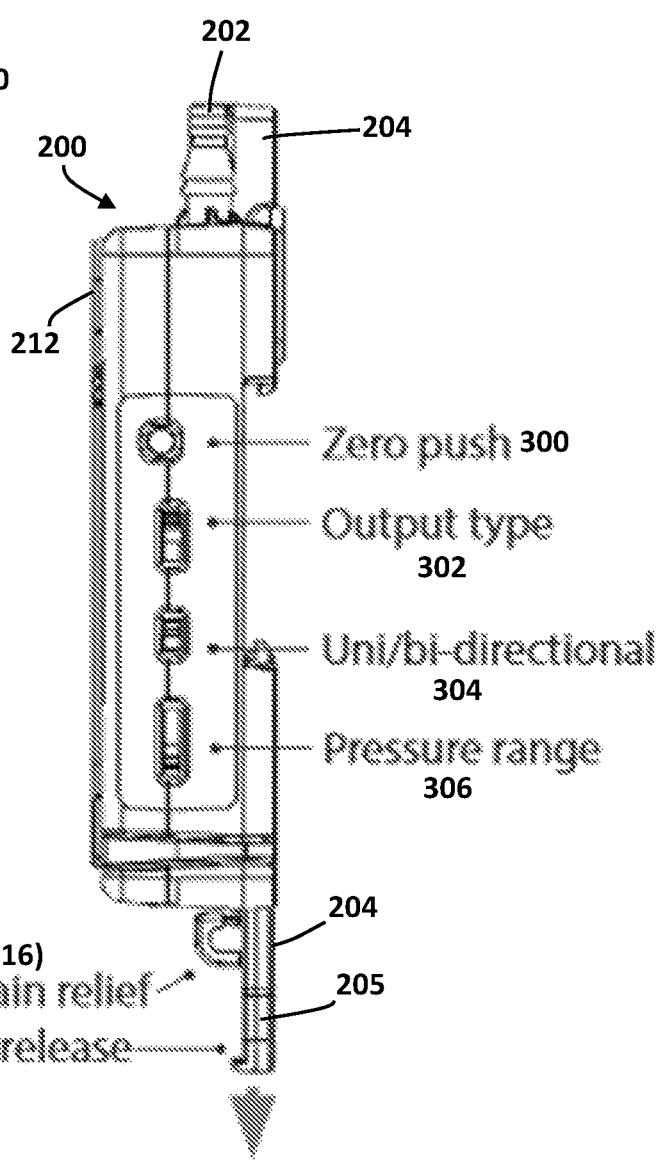
FIG. 10B depicts a side view of the first embodiment of FIG. 10A.
Figures 11A, 11B:
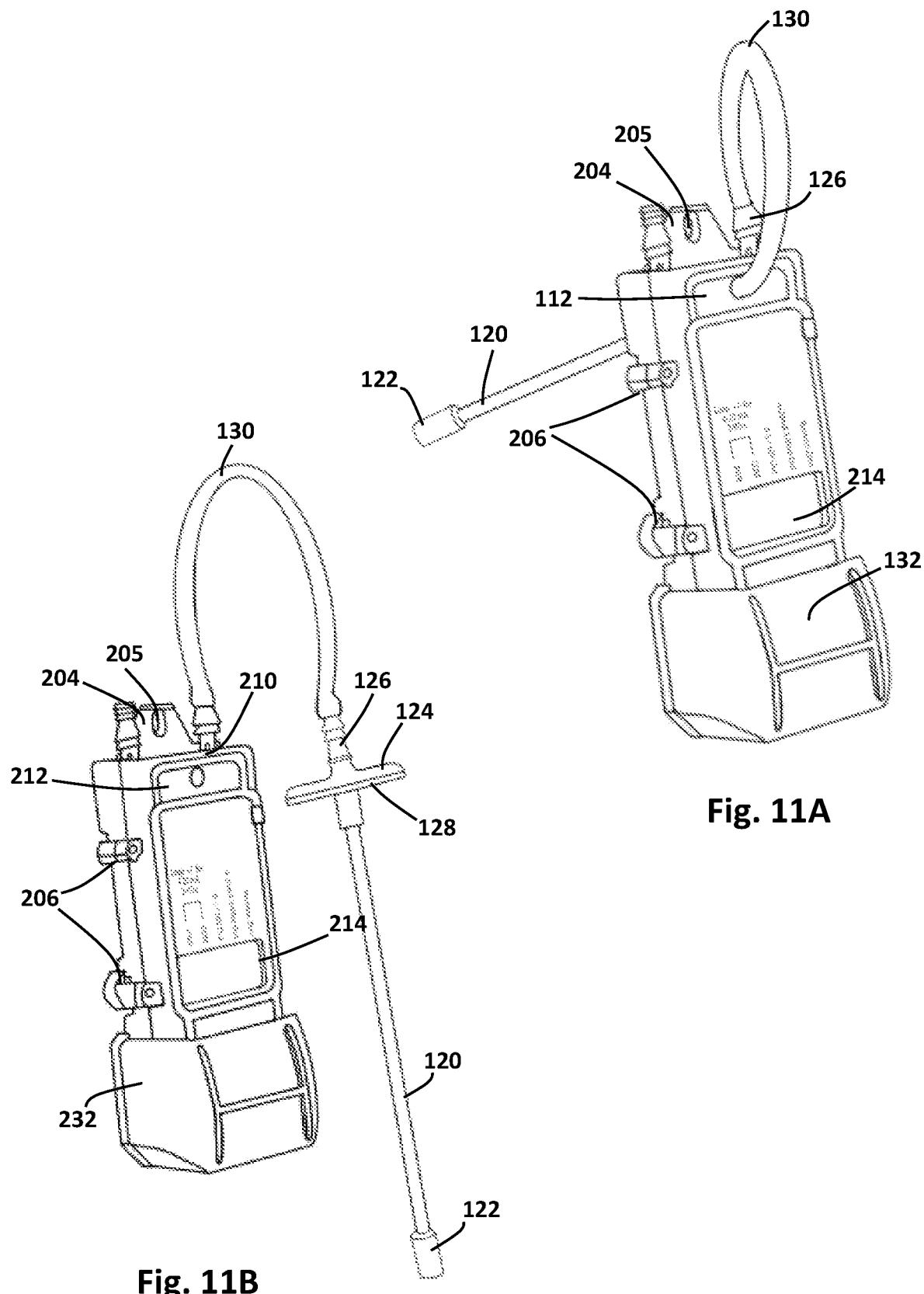
FIG. 11A depicts the pressure sensor of FIGS. 10A-B and the probe of FIG. 3 configured for a duct mount application.
FIG. 11B depicts the pressure sensor of FIGS. 10A-B and the probe of FIG. 3 configured for a remote mount application.
Figure 12A:
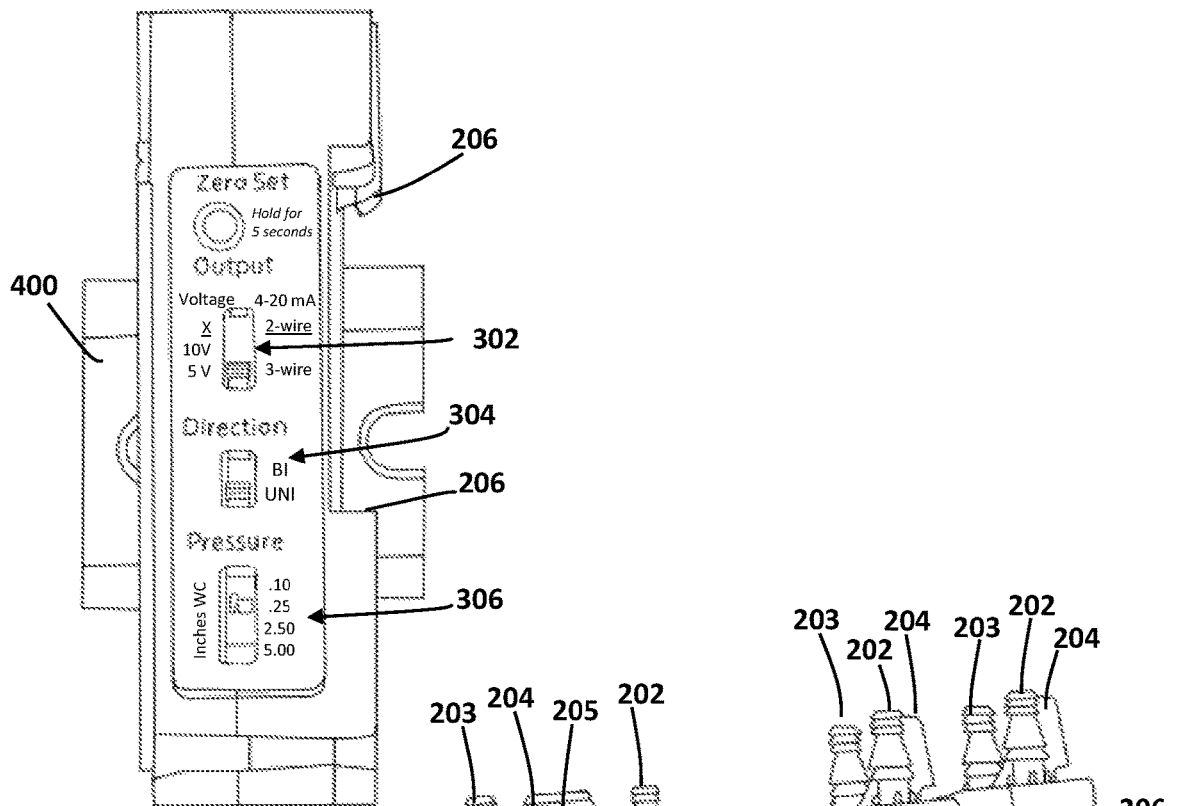
FIG. 12A depicts a pressure sensor of FIG. 10A-B in a side-mount configuration.
Figure 12B:
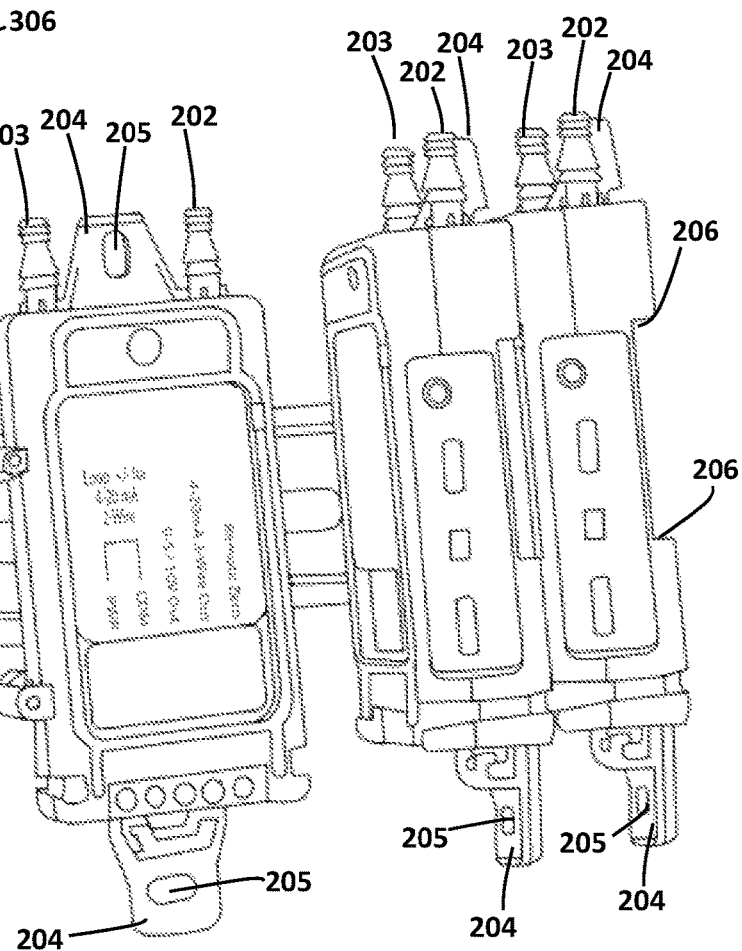
FIG. 12B depicts three pressure sensors of FIGS. 10A-B mounted in two alternate mounting configurations.
Figure 13:
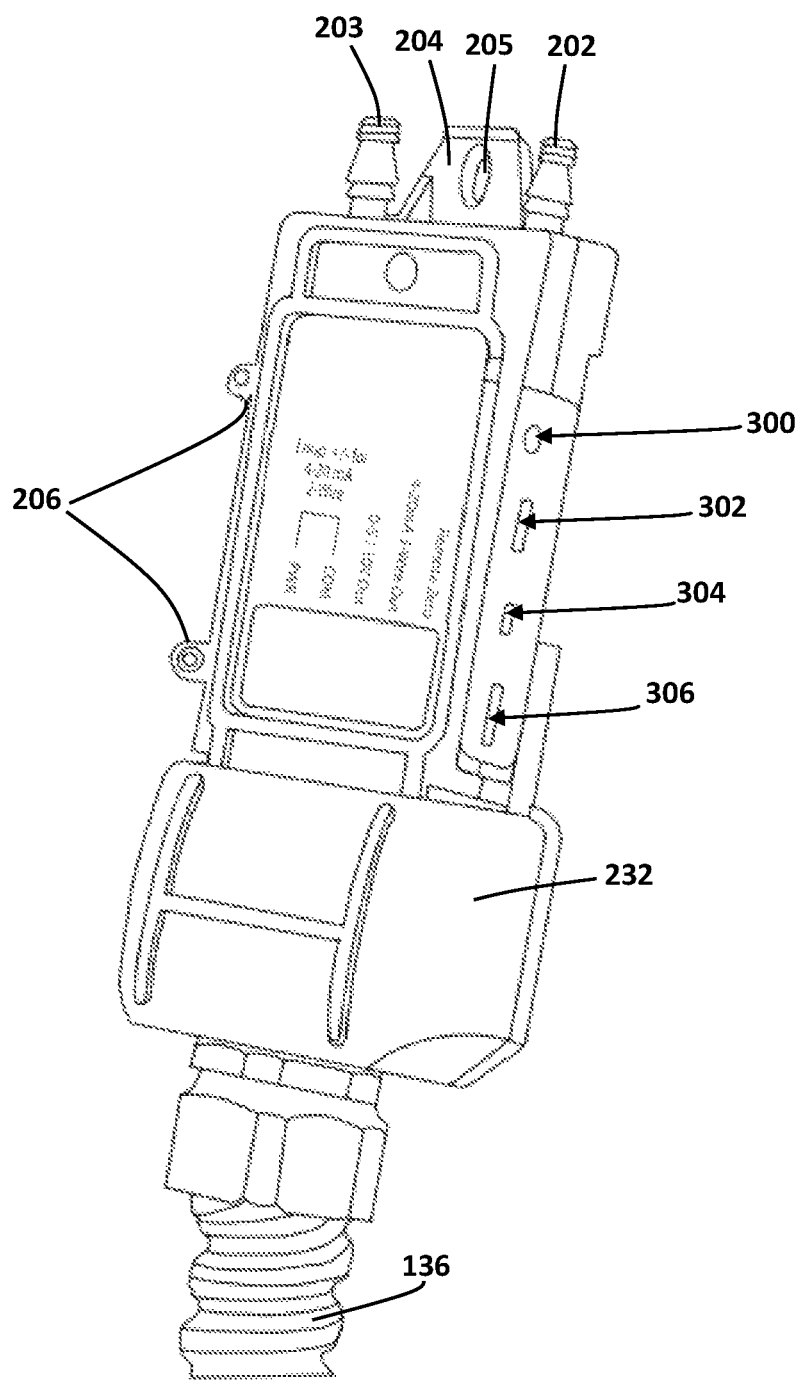
FIG. 13 depicts the pressure sensor of FIGS. 10A-B employing the conduit/terminal cover of FIG. 8.

Continuing with FIG. 8, conduct/terminal cover 132 is illustrated with a cutout 134 that can be knocked out and is sized to accept a common conduit size, such as ⅜" flex connector conduit 136.

A second present embodiment of a pressure sensor is illustrated in FIGS. 10A-13, and can comprise an embodiment of a universal dry media pressure transmitter. The second embodiment can include variable controls to measure accurately multiple ranges optimized for building (zone) pressure, filter measurement, and static duct applications. Enabling selectable outputs and uni/bi-directional readings allows system installers to reduce inventory of pressure sensor equipment. As above, one or more embodiments of an innovative probe can be integrated with the present embodiment of the pressure transmitter unit, or can be mounted remotely for static pressure. An optional LCD for panel mount readings and set up can also be provided to facilitate installation and use in varied installation configurations.

FIGS. 10A-13 illustrate such second present embodiment of a pressure sensor. Such second embodiment can comprise a second example of a universal dry media pressure transmitter. The embodiments illustrated in FIGS. 10A-13 depict various aspects of the novel subject matter and can include, without limitation, variable controls to accurately measure multiple ranges optimized for building (zone) pressure, filter measurement, and static duct applications, etc. In FIGS. 10A-13, like numbers in the 200 series correspond to like numbers in the 100 series for FIGS. 2A-9. However, novel aspects of the second embodiment (FIGS. 10A-13) can include enabling selectable outputs (302) and uni- or bi-directional reading selection (304) to match the intended application. To reduce the required inventory of pressure sensor equipment they have to maintain to accommodate different installation requirements, a single unitary pressure sensor/transmitter, consistent with the present subject matter can enable a variety of settings/configurations (306) (e.g., 5", 10", and 25" versions with four selectable sub-ranges, 1250, 2500, 6250 Pa versions with four selectable sub-ranges, dual 0-5/10 VDC, 4-20 mA (loop and 3-wire), etc.)

One or more embodiments, such as those illustrated in FIGS. 10A-13, can comprise a pressure transmitter/pressure sensor that can accommodate one or more embodiments of an innovative probe, which can be integrated with the present embodiment of the pressure transmitter unit, or can be mounted remotely for static pressure. An optional LCD for panel mount readings and set up can also be provided to facilitate installation and use in varied installation configurations. unit that can be mounted remotely for static pressure. An optional LCD display and/or LED indicator for panel mount readings and set up can also be provided to facilitate installation and use in varied installation configurations.

Present embodiments can comprise a convenient form factor that facilitates simplified installation while accommodating one or more flexible installation configurations (to accommodate factors such as mounting surface, available space, etc.). For example, present embodiments can be installed by screw mounting the sensor directly to duct, or in panel using self-tapping screws, or by attaching it to a DIN rail (2 possible orientations for DIN mounting, BACK and LEFT SIDE). A control (illustrated herein as a slide switch) can be positioned to select an appropriate analog output (4-20 mA 2-Wire or 3-Wire configurations or 5V/10V). A control (illustrated herein as a slide switch can also be positioned to select a desired pressure range and operation mode (Uni or Bi-Directional). An installer can plumb air lines to sensor hose barbs (where, in one embodiment, are sized to accept ⅛" & ¼" ID tubing). High (+) and low (−) ports are labeled on the sensor. The sensor can then be wired for voltage or current output as shown in the wiring diagrams illustrated in FIG. 12 to apply power to sensor. With no pressure applied, press the ZERO SET button for 2-seconds. (For best results, temporarily connect high and low pressure ports).

One or more present embodiments can also include LED indicators that can be configured to provide installation and operation indications (e.g., an LED can flash every 5 seconds for normal operation, an LED indicator can rapidly flash when applied pressure is greater than 110% of selected range, and/or an LED indicator can rapidly flash momentarily when zeroing process is complete, as but a few examples, presented for illustration and not by way of limitation).

Figure 14:
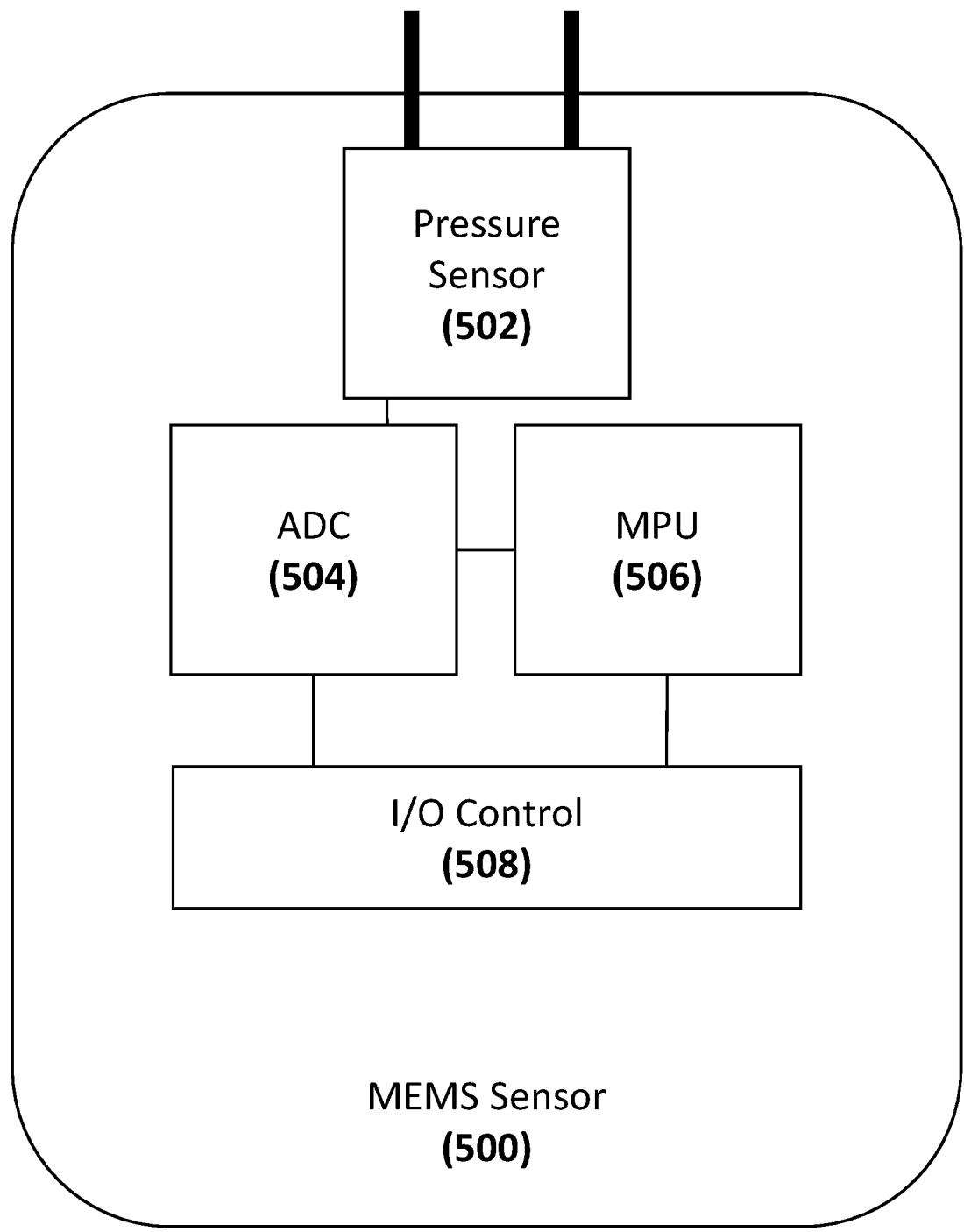
FIG. 14 depicts a block diagram illustrating example components of a pressure sensor consistent with the present subject matter.

FIG. 14 illustrates a conceptual block diagram illustrating various components of one or more pressure sensors consistent with the present subject matter. Such components include a MEMS Sensor 500 that includes a pressure sensing circuit 502, and analog-to-digital converter 504, and a microcontroller unit (506). In a present embodiment, the MEMS sensor includes a piezoresisitve Wheatstone bridge.

Sensors for pressure, load, temperature, acceleration and many other physical quantities often take the form of a Wheatstone bridge. These sensors can be extremely linear and stable over time and temperature.

Figure 15A:
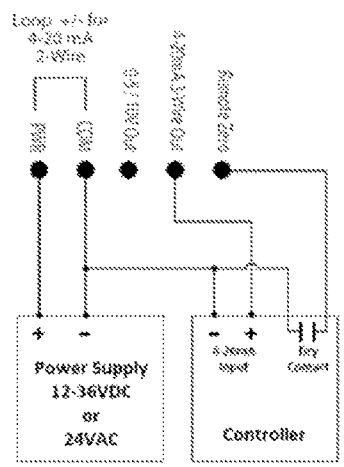
FIG. 15A depicts a first embodiment of a wiring diagram for one or more pressure sensors consistent with the present subject matter.
Figure 15B:
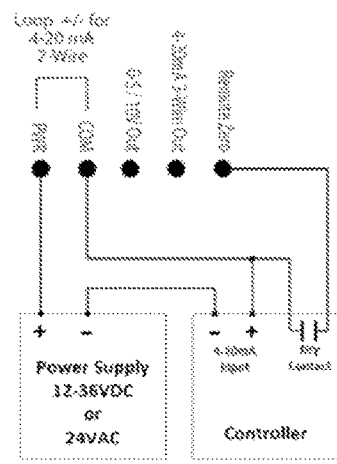
FIG. 15B depicts a second embodiment of a wiring diagram for one or more pressure sensors consistent with the present subject matter.
Figure 15C:
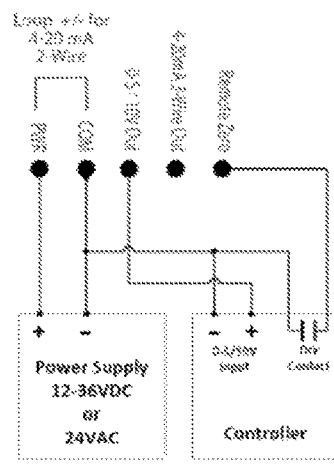
FIG. 15C depicts a third embodiment of a wiring diagram for one or more pressure sensors consistent with the present subject matter.

FIGS. 15A-C depicts example of wiring diagrams consistent with one or more embodiments of pressure sensors, depending on the intended application and desired signaling involved, consistent with the present subject matter for the first embodiment of FIGS. 2A-9 and second embodiment of FIGS. 10A-13, as well as one or more alternative or additional embodiments consistent with the present subject matter.

It will be obvious to those having skill in the art that many changes may be made to the details of the above-described embodiments without departing from the underlying principles of the invention. The scope of the present invention should, therefore, be determined with reference to the claims made thereto.

The invention claimed is:

1. A pressure sensing apparatus for measuring pressure in a dry gaseous medium, comprising:
a pressure sensing circuit; and
a housing encompassing the pressure sensing circuit;
wherein, the housing includes:
at least one pressure port for cooperative engagement with a probe provisioned to measure pressure; and
one or more members for mounting the housing in selected configuration, the selected configuration being chosen from among a plurality of mounting configurations enabled by the one or more members.

2. The pressure sensing apparatus of claim 1, wherein the one or more members include mounting tabs for mounting the housing to a duct conveying a dry gaseous medium.

3. The pressure sensing apparatus of claim 1, wherein the one or more members include at least one flexible member for removably mounting the housing to a DIN rail in a plurality of configurations.

4. The pressure sensing apparatus of claim 3, wherein the at least one flexible member includes a spring member for removably mounting the housing to the DIN rail with spring tension.

5. The pressure sensing apparatus of claim 1, wherein the probe is provisioned proximate to the housing.

6. The pressure sensing apparatus of claim 1, wherein the probe is provisioned remote from the housing.

7. The pressure sensing apparatus of claim 6, wherein the pressure sensing apparatus additionally includes a hose in cooperative engagement with the probe, and the pressure port includes a hose barb sized for engaging the hose cooperative engaged with the probe.

* * * * *